United States Patent
Kim et al.

(10) Patent No.: US 8,124,990 B2
(45) Date of Patent: Feb. 28, 2012

(54) SEMICONDUCTOR LIGHT EMITTING DEVICE HAVING AN ELECTRON BARRIER LAYER BETWEEN A PLURALITY OF ACTIVE LAYERS

(75) Inventors: Tae Yun Kim, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 246 days.

(21) Appl. No.: 12/144,246

(22) Filed: Jun. 23, 2008

(65) Prior Publication Data
US 2008/0315179 A1 Dec. 25, 2008

(30) Foreign Application Priority Data
Jun. 22, 2007 (KR) .................. 10-2007-0061427

(51) Int. Cl.
*H01L 29/06* (2006.01)
*H01L 31/00* (2006.01)
*H01L 27/15* (2006.01)
*H01L 31/12* (2006.01)
*H01L 33/00* (2010.01)

(52) U.S. Cl. ........... 257/96; 257/13; 257/14; 257/79; 257/94; 257/E33.027; 257/E33.028; 257/E33.034

(58) Field of Classification Search .............. None
See application file for complete search history.

(56) References Cited

U.S. PATENT DOCUMENTS

| | | | | |
|---|---|---|---|---|
| 6,995,389 B2 * | 2/2006 | Kim et al. | ......... | 257/13 |
| 7,098,482 B2 * | 8/2006 | Cho et al. | ......... | 257/79 |
| 7,649,195 B2 * | 1/2010 | Lee et al. | ......... | 257/13 |
| 2002/0117674 A1 * | 8/2002 | Sugawara | ......... | 257/79 |
| 2005/0161683 A1 * | 7/2005 | Hahm et al. | ......... | 257/79 |
| 2005/0236642 A1 * | 10/2005 | Sakai et al. | ......... | 257/103 |
| 2006/0131558 A1 * | 6/2006 | Sato et al. | ......... | 257/17 |
| 2006/0192195 A1 * | 8/2006 | Lee | ......... | 257/14 |
| 2007/0034883 A1 * | 2/2007 | Ohba | ......... | 257/85 |
| 2009/0050874 A1 * | 2/2009 | Kim et al. | ......... | 257/13 |

OTHER PUBLICATIONS

Bechstedt et al. "Energy gap and optical properties of InxGa1-xN", (2003), phys. stat. sol. (a) 195, No. 3, 628-633.*

* cited by examiner

*Primary Examiner* — N Drew Richards
*Assistant Examiner* — Michael Jung
(74) *Attorney, Agent, or Firm* — Birch, Stewart, Kolasch, Birch, LLP

(57) ABSTRACT

Provided is a semiconductor light emitting device. The semiconductor light emitting device comprises a first conductive type semiconductor layer, an active layer, and a second conductive type semiconductor layer. The active layer comprises a first active layer, a second active layer, an electron barrier layer on the first conductive type semiconductor layer. The first active layer and the second active layer comprise a quantum well layer and a quantum barrier layer. The electron barrier layer is formed between the first active layer and the second active layer. The second conductive type semiconductor layer is formed on the active layer.

19 Claims, 4 Drawing Sheets

SEMICONDUCTOR LIGHT EMITTING DEVICE HAVING AN ELECTRON BARRIER LAYER BETWEEN A PLURALITY OF ACTIVE LAYERS

CROSS-REFERENCE TO RELATED APPLICATIONS

The present application claims priority under 35 U.S.C. 119 to Korean Patent Application No. 10-2007-0061427, filed Jun. 22, 2007.

BACKGROUND

A III-V group nitride semiconductor has been variously used for an optical device such as blue/green light emitting diodes (LEDs), a high speed switching device such as a metal semiconductor field effect transistor (MOSFET) and a hetero junction filed effect transistor (HEMT), a light source of an illumination or a display apparatus, and the like. In particular, a light emitting device using an III group nitride semiconductor has a direct transition-type bandgap corresponding to the range of visible rays to ultraviolet rays, and can perform high efficient light emission The nitride semiconductor has been mainly utilized as a LED or a laser diode (LD), and research for improving the manufacturing process or light efficiency has been conducted.

SUMMARY

Embodiments provide a semiconductor light emitting device in which a electron barrier layer can be formed on a middle portion of an active layer to improve combination probability of electrons and holes within the active layer.

Embodiments provide a semiconductor light emitting device in which a electron barrier layer can be formed on a middle portion of an active layer or around an n-type semiconductor layer to uniformly distribute electrons and holes within the active layers.

An embodiment provides a semiconductor light emitting device comprising: a first conductive type semiconductor layer; an active layer comprising a first active layer, a second active layer, an electron barrier layer on the first conductive type semiconductor layer, wherein the first active layer and the second active layer comprise a quantum well layer and a quantum barrier layer, and the electron barrier layer is between the first active layer and the second active layer; and a second conductive type semiconductor layer on the active layer.

An embodiment provides a semiconductor light emitting device comprising: a first conductive type semiconductor layer; an active layer comprising a multi-quantum well structure on the first conductive type semiconductor layer, the active layer comprising a electron barrier layer between a plurality of quantum well layers; and a second conductive type semiconductor layer on the active layer.

An embodiment provides a semiconductor light emitting device, comprising: a first conductive type semiconductor layer; an active layer comprising a first active layer, a second active layer, an electron barrier layer on the first conductive type semiconductor layer, wherein the first active layer and the second active layer comprises a quantum well layer and a quantum barrier layer, and an energy bad gap of the electron barrier layer is greater than that of the quantum barrier layer between the first active layer and the second active layer; and a second conductive type semiconductor layer on the active layer.

DETAILED DESCRIPTION OF THE EMBODIMENTS

Hereinafter, a semiconductor light emitting device according to embodiments will be described with reference to the accompanying drawings.

Figure 1:
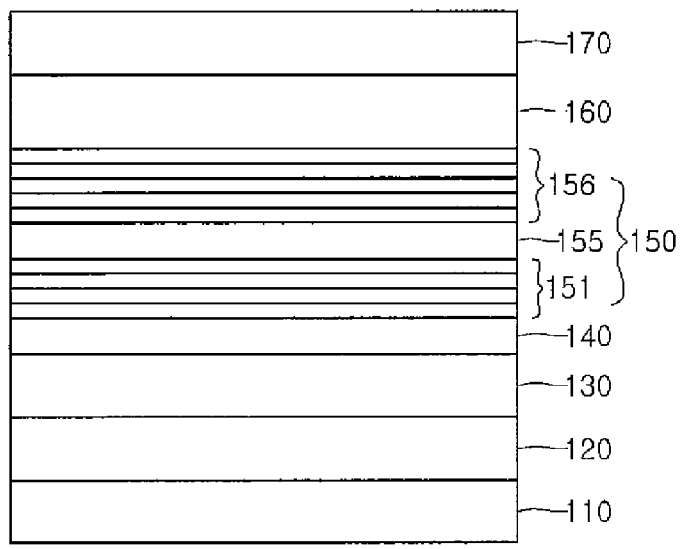
FIG. 1 is a side cross-sectional view of a semiconductor light emitting device according to an embodiment.

FIG. 1 is a side cross-sectional view of a semiconductor light emitting device according to an embodiment.

Referring to FIG. 1, a semiconductor light emitting device comprises a substrate 110, an undoped semiconductor layer 120, a first conductive type semiconductor layer 130, a first conductive type cladding layer 140, an active layer 150, a second conductive cladding layer 160, and a second conductive type semiconductor layer 170.

The substrate may be formed of at least one of sapphire ($Al_2O_3$), SiC, Si, GaAs, GaN, ZnO, GaP, InP, and Ge. Also, the substrate 111 may comprise a substrate having a conductive characteristic. A concave-convex pattern may be formed on and/or under the substrate 110. The concave-convex pattern may have one of stripe, lens, cylindrical, and cone shapes.

A nitride semiconductor is grown on the substrate 110. Growth equipment may use an E-beam evaporator, a physical vapor deposition (PVD) apparatus, a chemical vapor deposition (CVD) apparatus, a plasma laser deposition (PLD) apparatus, a dual-type thermal evaporator, a sputtering apparatus, and a metal organic chemical vapor deposition (MOCVD) apparatus. However, the present disclosure is not limited to the equipment.

The undoped semiconductor layer 120 is formed on the substrate 110. A buffer layer (not shown) is formed between the substrate 110 and the undoped semiconductor layer 120 to mitigate lattice mismatch therebetween. The buffer layer may be formed of at least one of GaN, InN, AlN, InGaN, AlGaN, InAlGaN, and AlInN. At least one of the undoped semiconductor layer 120 and the buffer layer 113 may be provided. Also, both the undoped semiconductor layer 120 and the buffer layer 113 may be not provided, or may not exist.

The first conductive type semiconductor layer 130 is formed on the undoped semiconductor layer 120. The first conductive type semiconductor layer 130 serves as a first electrode contact layer. The first conductive type semiconductor layer 130 may be formed of at least one of GaN, InN, AlN, InGaN, AlGaN, InAlGaN, and AlInN. First conductive type dopants are doped into the first conductive type semiconductor layer 130. The first conductive type dopants comprise Si, Ge, Sn, Se, and Te.

The first conductive type cladding layer 140 is formed on the first conductive type semiconductor layer 130. The first conductive type cladding layer 140 may comprise a single n-type semiconductor layer or a multilayer n-type semiconductor layer. The n-type semiconductor layer comprises an AlGaN layer or an AlInGaN layer and is doped with n-type dopants. The first conductive type cladding layer 140 may be not provided.

The active layer 150 is formed on the first conductive type cladding layer 140. The second conductive type cladding layer 160 is formed on the active layer 150.

The active layer 150 may comprise a multi-quantum well (MQW) structure. A cycle of a quantum well layer and a quantum barrier layer may be repeated one time to twenty times to form the active layer 150. The quantum well layer may be formed of InGaN. The quantum barrier layer may be formed of one of AlInGaN, AlGaN, TnGaN, and GaN. Materials of the quantum well layer and the quantum barrier layer may be different according to an emission wavelength, but the present disclosure is not limited thereto. The quantum well/quantum barrier layers may be formed of AlGaN/GaN, InGaN/GaN, InGaN/InGaN, AlGaAs/GaAs, InGaAs/GaAs, InGaP/GaP, AlInGaP/InGaP, and InP/GaAs. The emission wavelength may be different according to a composition ratio of indium (In) or aluminum (Al), but the present disclosure is not limited thereto. Hereinafter, for the convenience in description, the quantum well layer comprising an InGaN layer and the quantum barrier layer comprising the AlGaN layer will be described.

The active layer 150 comprises a lower active layer 151, and an upper active layer 156, and an electron barrier layer 155. The active layer comprises a multi-quantum well structure with a cycle of the quantum well layer and the quantum barrier layer. At least one of the quantum barrier layers serves as the electron barrier layer 155.

The lower active layer 151 is formed on the first conductive type cladding layer 140. The upper active layer 156 is formed under the second conductive type cladding layer 160. The electron barrier layer 155 is formed between the lower active layer 151 and the upper active layer 156. That is, the electron barrier layer 155 is formed between multi-quantum well layers on a middle portion of the active layer 150. The electron barrier layer 155 has a thickness thicker than that of different quantum barrier layer, and a band gap thereof is higher.

The active layer 150 comprises the quantum well layer formed of InGaN and the quantum barrier layer formed of AlGaN which are grown at a predetermined growth temperature, e.g., a temperature ranging from about 700° C. to about 1000° C. by supplying NH$_3$, trimethyl gallium (TMGa) (or triethyl gallium (TEGa)), trimethylindium (TMIn), and triethylaluminum (TEAl) as a source gas using H$_2$ and/or N$_2$ as a carrier gas.

The lower and upper active layers 151 and 156 of the active layer 150 may grown at the same temperature range as the electron barrier layer 155 of the active layer 150, or a temperature range different from the electron barrier layer 155 of the active layer 150. For example, the lower and upper active layers 151 and 156 may be grown at a temperature ranging from about 700° C. to about 950° C., and the electron barrier layer 155 may be grown at a temperature ranging from about 700° C. to about 1000° C.

The electron barrier layer 155 may comprise a nitride semiconductor formed of at least one of Al and In.

The electron barrier layer 155 comprises an Al$_x$In$_y$Ga$_{1-x-y}$N ($0 \leq x \leq 1$, $0 \leq y < 0.5$, $x+y<1$) electron barrier layer which is grown at a predetermined growth temperature, e.g., a temperature ranging from about 700° C. to about 1000° C. by selectively supplying NH$_3$, TMGa (or TEGa), TMIn, and TEAl as the source gas using H$_2$ as the carrier gas. For example, the electron barrier layer 155 may comprise a thickness ranging from about 150 Å to about 300 Å. The electron barrier layer 155 may be formed of the same material as the quantum barrier layer, or a material different from the quantum barrier layer.

An energy band gap of the electron barrier layer 155 may be about 1.5 times to about twice greater than that of the quantum barrier layer. When the energy band gap of the quantum barrier layer has about 3.4 V, the energy band gap of the electron barrier layer 155 may have about 6 V.

Since a distribution profile of electrons and holes is changed by the electron barrier layer 155, active layer 150 can improve radiation recombination probability of the electrons and the holes.

The second conductive type cladding layer 160 may comprise a single p-type semiconductor layer or a multilayer p-type semiconductor layer on the active layer 150. The p-type semiconductor layer comprises an AlGaN layer or an AlInGaN layer and is doped with the p-type dopants. The second conductive type cladding layer 160 may be not provided.

The second conductive type semiconductor layer 170 is formed on the second conductive type cladding layer 160. The second conductive type semiconductor layer 170 may comprise a single layer or a multilayer. Also, the second conductive type semiconductor layer 170 may comprise a p-type semiconductor layer doped with p-type dopants. The second conductive type semiconductor layer 170 may serve as an electrode contact layer. The p-type semiconductor layer may be formed of one of compound semiconductors such as GaN, InN, AlN, InGaN, AlGaN, InAlGaN, and AlInN. The p-type dopants may add at least one of Mg, Zn, Ca, Sr, and Ba.

A transparent electrode layer (not shown) is formed on the second conductive type semiconductor layer 170. The transparent electrode layer may be formed of one of ITO, ZnO, IrOx, RuOx, and NiO. In the semiconductor light emitting device 100, the first conductive type semiconductor layer 130 may serve as the n-type semiconductor layer, and the second conductive type semiconductor layer 170 may serve as the p-type semiconductor layer, or may be implemented in reverse structure. Also, The n-type semiconductor layer or the p-type semiconductor layer may be formed on the second conductive type semiconductor layer 170. Therefore, the semiconductor light emitting device 100 may comprise one structure of an N—P junction structure, a P—N junction structure, an N—P—N junction structure, and a P—N—P junction structure.

The electron barrier layer 155 can be formed on a middle portion of the active layer 150 to improve combination probability of electrons and holes within the active layer 150. That is, a movement velocity of an electron injected into the first conductive type semiconductor layer 130 is about five times to ten times greater than that of a hole generated in the second conductive type semiconductor layer 170. As a result, light is not efficiently emitted around the first conductive type semiconductor layer 130. To solve this limitation, the relatively electron barrier layer 155 can be formed on a middle portion or a middle lower portion of the active layer 150 to improve recombination probability of the electrons and the holes due to an electron confinement effect in the lower and upper active layers 151 and 156. Therefore, light generation efficiency can be improved on the whole.

The electron barrier layer 155 can be formed on the middle portion or around the n-type semiconductor layer of the active layer 150 to uniformly distribute the electrons and the holes within the active layers, thereby increasing light generation.

The light generation efficiency can be improved in a lower portion of the active layer 150 due to the electron confinement effect. In addition, an excess electron leakage current can be prevented in an upper portion of the active layer 150. Therefore, the active layer 150 can improve the light efficiency and a growth of an LED chip.

Figure 2:
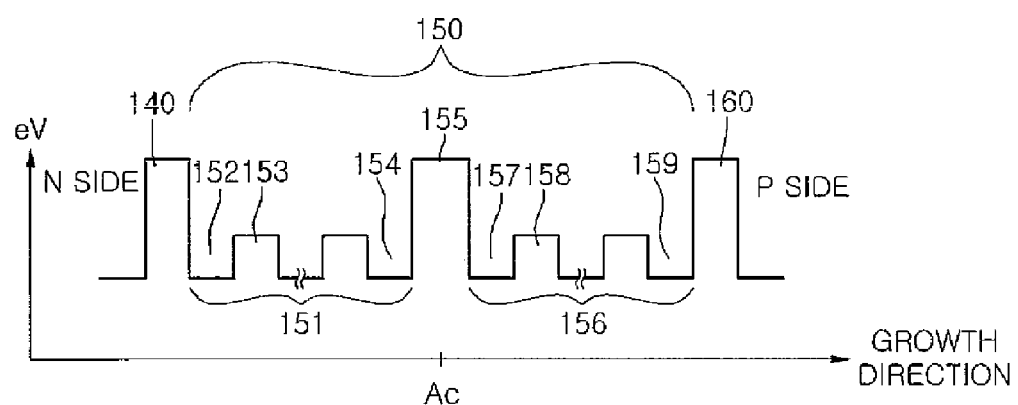
FIG. 2 is a cross-sectional view illustrating an energy band of an active layer according to a first embodiment in the semiconductor light emitting device of FIG. 1.

FIG. 2 is a cross-sectional view illustrating an energy band of an active layer according to a first embodiment in the semiconductor light emitting device of FIG. 1.

Referring to FIG. 2, an active layer 150 comprises a lower active layer 151, an electron barrier layer 155, and an upper active layer 156.

The lower active layer 151 is formed in a lower portion of the active layer 150. The lower active layer 151 is formed between the electron barrier layer 155 and a first conductive type cladding layer 140. The lower active layer 151 comprises a cycle of a quantum well layer 152 and a quantum barrier layer 153, and the quantum well layer 152 and the quantum barrier layer 153 are alternately formed.

The active layer 150 starts on the first conductive type cladding layer 140. The quantum well layer 152 of the lower active layer 151 may first start, or the quantum barrier layer may first start, but the present disclosure is not limited thereto.

The active layer 150 ends under a second conductive type cladding layer 160. A quantum well layer 159 of the upper active layer 151 may last end, or a quantum barrier layer may last end, but the present disclosure is not limited thereto.

The cycle of the quantum well layer 152 and the quantum barrier layer 153 may be repeated one time or more to form the lower active layer 151. A cycle of the quantum well layer 157 and the quantum barrier layer 158 may be repeated one time or more to form the upper active layer 156.

When the active layer 150 comprises ten cycles, the lower active layer 151 may comprise about four cycles to five cycles, and the upper active layer 156 may comprise about five cycles to six cycles. The lower active layer 151 may comprise the same cycle as the upper active layer 156, or the lower active layer may comprise more cycles.

Each of quantum well layers 152, 154, 157, and 159 of the lower active layer 151 and the upper active layer 156 may comprise an InGaN layer. Each of quantum barrier layers 153 and 158 may comprise one of GaN, AlGaN, InGaN, and AlInGaN layers, but the present disclosure is not limited thereto.

The lower active layer 151 and the upper active layer 156 comprise the quantum well layers 152, 154, 157, and 159 and the quantum barrier layers 153 and 158 which are grown at a predetermined growth temperature, e.g., a temperature ranging from about 700° C. to about 950° C. by supplying $NH_3$, TMGa (or TEGa), TMIn, and TEAl as a source gas using $H_2$ and/or $N_2$ as a carrier gas.

Each of the quantum well layers 152, 154, 157, and 159 may comprise a thickness ranging from about 15 Å to about 30 Å, and each of the quantum barrier layers 153 and 158 may comprise a thickness ranging from about 50 Å to about 300 Å.

The electron barrier layer 155 comprises an $Al_xIn_yGa_{1-x-y}N$ ($0 \leq x \leq 1$, $0 \leq y < 0.5$, $x+y<1$) electron barrier layer which is grown at a predetermined growth temperature, e.g., a temperature ranging from about 700° C. to about 1000° C. by supplying $NH_3$, TMGa (or TEGa), TMIn, and TEAl as the source gas using $H_2$ as the carrier gas.

The electron barrier layer 155 is formed between the multi-quantum well layers 154 and 157 in a middle region Ac of the active layer 150. For example, the electron barrier layer 155 may comprise a thickness ranging from about 150 Å to about 300 Å. An energy band gap of the electron barrier layer 155 may be about 1.5 times to about twice greater than that of each of the quantum barrier layers 153 and 158. For example, when the energy band gap of each of the quantum barrier layers 153 and 158 has about 3.4 V, the energy band gap of the electron barrier layer 155 may have about 6 V.

The electron barrier layer 155 and the quantum well layer 154 of the lower active layer 151 may operate in one cycle, or the electron barrier layer 155 and the quantum well layer 157 of the upper active layer 156 may operate in one cycle, but the present disclosure is not limited thereto. The electron barrier layer 155 may be implemented as at least one of the quantum barrier layers 153 and 158, and its thickness may be thicker than that of a different quantum barrier layer. Also, its energy bad gap may be greater than that of the different quantum barrier layer.

The electron barrier layer 155 can be formed on a middle portion of the active layer 150 to improve combination probability of electrons and holes within the active layer 150 by an electron confinement effect due to the electron barrier layer 155.

In addition, the electron barrier layer 155 can be formed on the middle portion of the active layer 150 to uniformly distribute the electrons and the holes within the active layer 150, thereby increasing light generation. Also, an excess electron leakage current can be prevented in an upper portion of the active layer 150. Therefore, the active layer 150 can improve the light efficiency and a growth of an LED chip.

Figure 3:
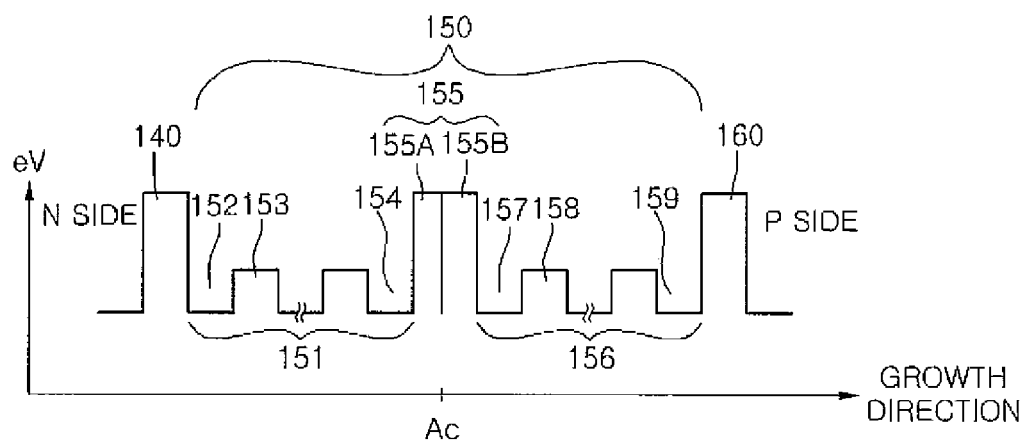
FIG. 3 is a cross-sectional view illustrating an energy band of an active layer according to a second embodiment.

FIG. 3 is a cross-sectional view illustrating an energy band of an active layer according to a second embodiment. Here, the same reference numerals are designated to the same elements as those of the first embodiment, and respective descriptions thereof will be omitted.

Referring to FIG. 3, an active layer 150 comprises a lower active layer 151, a plurality of electron barrier layers 155 (155A and 155B), and an upper active layer 156.

For example, the plurality of electron barrier layers 155 (155A and 155B) may comprise about two to three electron barrier layers. The electron barrier layers 155 (155A and 155B) comprise a first electron barrier layer 155A and a second electron barrier layer 155B formed on the first electron barrier layer 155A.

The first and second electron barrier layers 155A and 155B may be formed of the same semiconductor material, or the first electron barrier layer 155A may be formed of a material different from a material of the second electron barrier layer 155B. The first electron barrier layer 155A may be formed of $Al_xIn_yGa_{1-x-y}N$, and the second electron barrier layer 155B may be formed of $Al_xGa_{1-x}N$. As a result, the electron barrier layer 155 may comprise $Al_xIn_yGa_{1-x-y}N/Al_xGa_{1-x}N$ ($0 \leq x \leq 1$, $0 \leq y < 0.5$, $x+y<1$) layers.

A thickness of the first electron barrier layer 155A may be equal to that of the second electron barrier layer 155B, or different from that of the second electron barrier layer 155B. For example, each of the first and second electron barrier layers 155A and 155B may comprise a thickness ranging from about 150 Å to about 300 Å.

A thickness of the electron barrier layers 155 (155A and 155B) is thicker than that of a different quantum barrier layer, e.g., a quantum barrier layer 153. Also, an energy band gap of the electron barrier layers 155 (155A and 155B) is about 1.5 times to about twice greater than that of the different quantum barrier layer. Therefore, light generation efficiency can be improved due to the electron confinement effect in the lower active layer 151 of the active layer 150. Also, the upper active layer 156 can prevent an excess electron leakage current.

Figure 4:
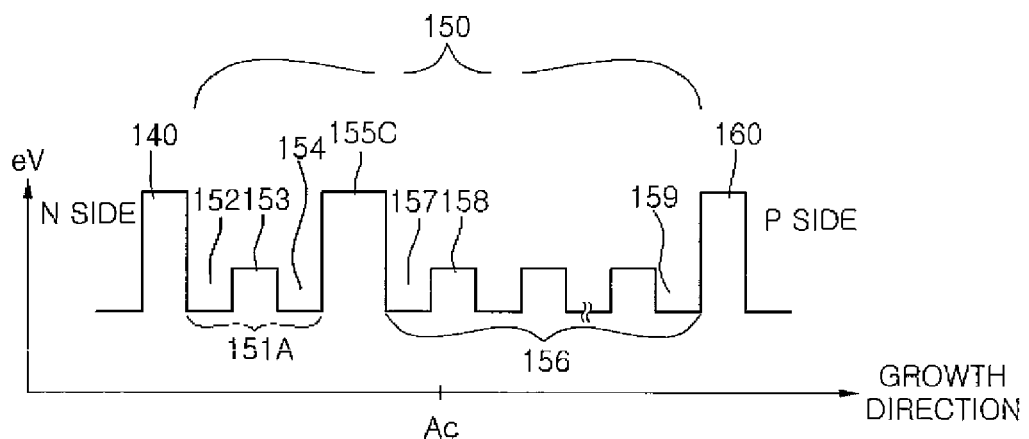
FIG. 4 is a cross-sectional view illustrating an energy band of an active layer according to a third embodiment.

FIG. 4 is a cross-sectional view illustrating an energy band of an active layer according to a third embodiment. Here, the same reference numerals are designated to the same elements as those of the second embodiment, and respective descriptions thereof will be omitted.

Referring to FIG. 4, an electron barrier layer 150C within an active layer 150 may be formed close to a first conductive type cladding layer 140 or a first conductive type semiconductor layer 130 with respect to a center Ac of the active layer 150. The electron barrier layer 150C may be closely formed further an n-type semiconductor layer than a p-type semiconductor layer.

A cycle of a lower active layer 151A of the active layer 150 is shorter than that of an upper active layer 156.

An energy band gap of an electron barrier layer 155C may be about 1.5 times to about twice greater than that of each of quantum barrier layers 153 and 158. For example, the electron barrier layer 155C may comprise a thickness ranging from about 150 Å to about 300 Å.

The lower active layer 151A of the active layer 150 can further improve an electron confinement effect when compared to the second embodiment, thereby improving light generation efficiency. In addition, the upper active layer 156 can prevent an excess electron leakage current.

As described in the first to second embodiments, the electron barrier layers 155 and 155C can be formed on a middle portion or a middle lower portion of the active layer 150 having a multi-quantum well structure to reduce an electron movement velocity within the active layer 150 and improve recombination probability of the electrons and the holes due to uniform distribution of the electrons and the holes, thereby improving the light generation efficiency.

Figure 5:
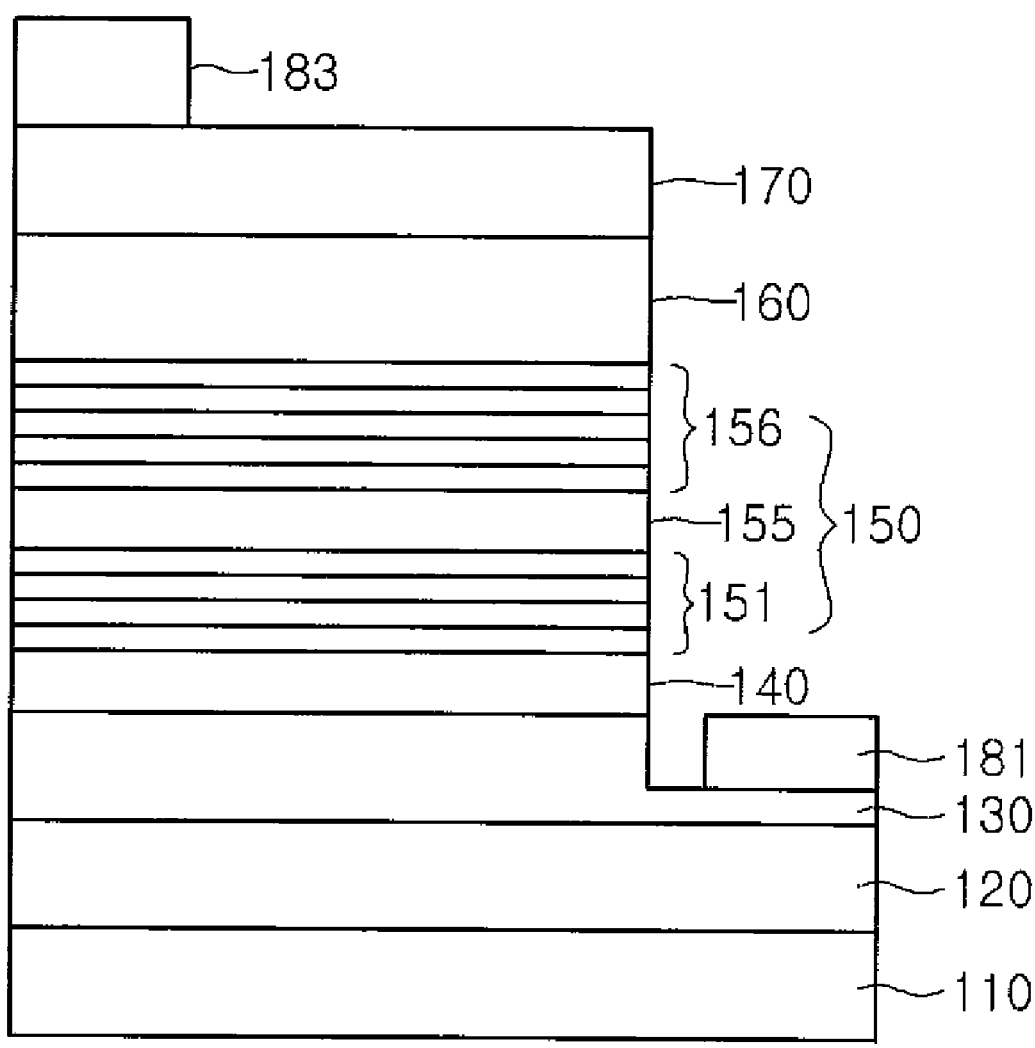
FIG. 5 is a side cross-sectional view of a horizontal type semiconductor light emitting device using FIG. 1.

FIG. 5 is a side cross-sectional view of a horizontal type semiconductor light emitting device using FIG. 1.

Referring to FIG. 5, in a horizontal type semiconductor light emitting device 100A, a first electrode 181 is formed on a first conductive type semiconductor layer 130, and a second electrode 183 is formed on a second conductive type semiconductor layer 183.

Figure 6:
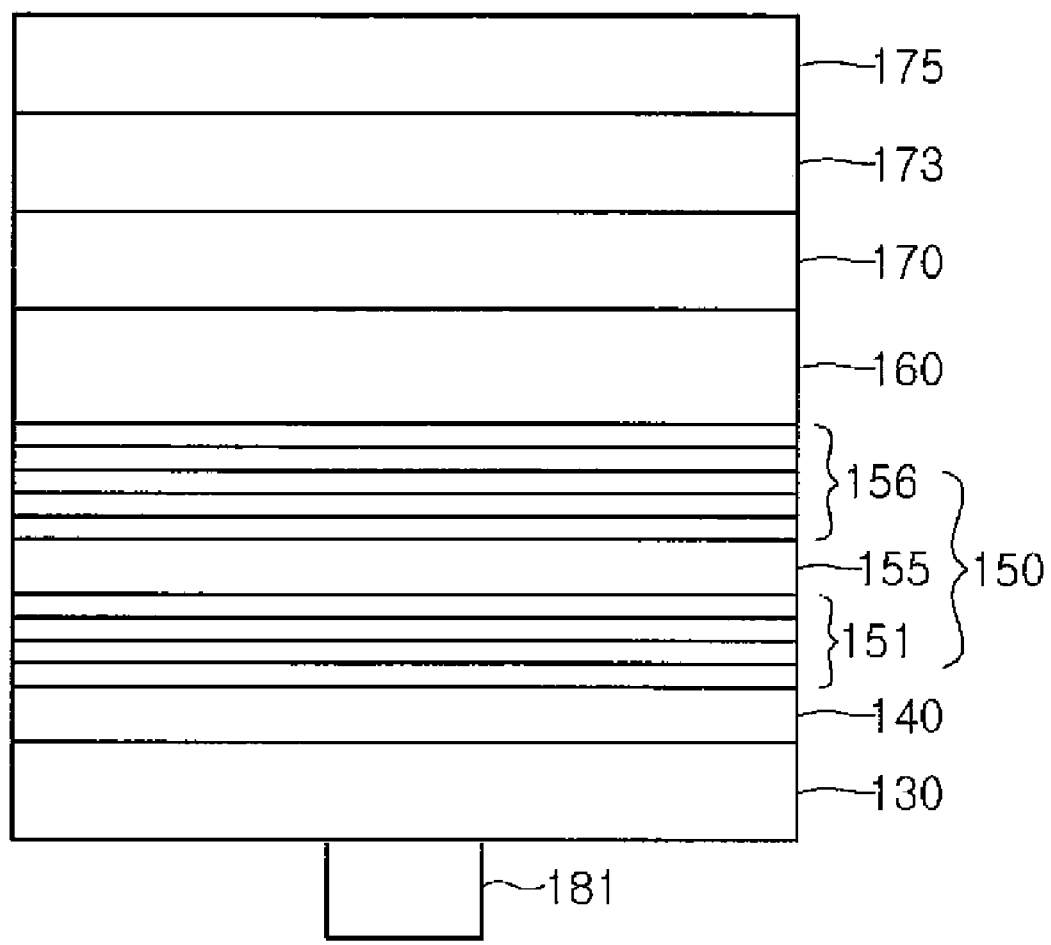
FIG. 6 is a side cross-sectional view of a vertical type semiconductor light emitting device using FIG. 1.

FIG. 6 is a side cross-sectional view of a vertical type semiconductor light emitting device using FIG. 1.

Referring to FIG. 6, in a vertical type semiconductor light emitting device 100B, a reflective electrode layer 173 is formed on the second conductive type semiconductor layer 170 of FIG. 1, and a conductive supporting substrate 175 is formed on the reflective electrode layer 173. The reflective electrode layer 173 comprises a single layer or a multilayer using at least one of materials such as Al, Ag, Pd, Rh, and Pt. The conductive supporting substrate may be formed of copper and gold, but the present disclosure is not limited thereto.

The substrate 110 of FIG. 1 is removed using a physical and/or chemical removing method. The physical removing method uses a laser lift off (LLO) method in which a laser beam having a predetermined wavelength is irradiated onto the substrate 110 to remove the substrate 110. In the chemical removing method, an etching solution is injected into the undoped semiconductor layer 120 of FIG. 1 to separate the substrate 110.

Thereafter, the first electrode 181 can be formed under the first conductive type semiconductor layer 130.

Although a compound semiconductor light emitting device comprising a P—N junction structure is used in the embodiments, the present disclosure is not limited thereto. For example, a compound semiconductor light emitting device comprising P—N, N—P—N, P—N—P junction structures may be used. The embodiments is not limited to the above-described structures, and various layers may be further formed between layers according to characteristics of the light emitting device.

In the following description, it will be understood that when a layer (or film), a region, a pattern, or components is referred to as being 'on' or 'under' another substrate, layer (or film), region, or patterns, it can be directly on the other layer or substrate, or intervening layers may also be present.

Any reference in this specification to "one embodiment," "an embodiment," "example embodiment," to, means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a first conductive type semiconductor layer;
an active layer comprising a first active layer, a second active layer, and an electron barrier layer, the active layer being formed on the first conductive type semiconductor layer,
wherein the first active layer and the second active layer each comprises a quantum well layer and a quantum barrier layer, and
wherein the electron barrier layer is between the first active layer and the second active layer; and
a second conductive type semiconductor layer on the active layer,
wherein the electron barrier layer and at least one of the quantum well layers of the active layer are in contact with each other,
wherein the first and second active layers each comprises a cycle of the quantum well layer and the quantum barrier layer,
wherein the electron barrier layer comprises an AlGaN based semiconductor layer,
wherein an energy band gap of the electron barrier layer is greater than an energy band gap of a quantum barrier layer of the first active layer or an energy band gap of a quantum barrier layer of the second active layer, and
wherein the electron barrier layer is physically contacted with the quantum well layer of the first active layer and the quantum well layer of the second active layer.

2. The semiconductor light emitting device according to claim 1, wherein the electron barrier layer is in a middle region of the active layer.

3. The semiconductor light emitting device according to claim 1, wherein the electron barrier layer is closer to the first conductive type semiconductor layer than the second conductive type semiconductor layer, and wherein the first conductive type semiconductor layer is an n-type semiconductor layer.

4. The semiconductor light emitting device according to claim 3, wherein the cycle of the first active layer is alternatively repeated about four times to about five times, and the cycle of the second active layer is alternatively repeated about five times to about six times.

5. The semiconductor light emitting device according to claim 1, wherein the electron barrier layer comprises an $Al_xIn_yGa_{1-x-y}N$ ($0<x\leq1$, $0\leq y<0.5$, $0<x+y<1$) layer.

6. The semiconductor light emitting device according to claim 1, wherein the energy band gap of the electron barrier layer is about 1.5 times to about twice greater than the energy band gap of the quantum barrier layer of the first active layer or the energy band gap of the quantum barrier layer of the second active layer.

7. The semiconductor light emitting device according to claim 1, wherein the electron barrier layer has a thickness thicker than a thickness of the quantum barrier layer of the first active layer or a thickness of the quantum barrier layer of the second active layer.

8. The semiconductor light emitting device according to claim 1, further comprising:
a first conductive type cladding layer in contact with a lower surface of the active layer; and
a second conductive type cladding layer in contact with an upper surface of the active layer,
wherein the first conductive type cladding layer is an n-type semiconductor layer and the second conductive type cladding layer is a p-type semiconductor layer.

9. The semiconductor light emitting device according to claim 1, wherein the first conductive type semiconductor layer comprises an n-type semiconductor layer, and the second conductive type semiconductor layer comprises a p-type semiconductor layer.

10. The semiconductor light emitting device according to claim 1, wherein the quantum well/quantum barrier layers of the first active layer and the second active layer are formed of at least one selected from a group consisting of AlGaN/GaN, InGaN/GaN, and InGaN/InGaN.

11. The semiconductor light emitting device according to claim 1,
wherein the electron barrier layer is closer to the first conductive type semiconductor layer than the second conductive type semiconductor layer, and
wherein the first conductive type semiconductor layer is an n-type semiconductor layer.

12. A semiconductor light emitting device comprising:
a first conductive type semiconductor layer;
an active layer on the first conductive type semiconductor layer and comprising a multi-quantum well structure, the active layer comprising an electron barrier layer between a plurality of quantum well layers; and
a second conductive type semiconductor layer on the active layer,
wherein the electron barrier layer is closer to the first conductive type semiconductor layer than the second conductive type semiconductor layer and has a thickness thicker than a thickness of a quantum barrier layer of the active layer,
wherein the electron barrier layer is in physical contact with an upper surface of a first quantum well layer of the plurality of quantum well layers and a lower surface of a second quantum well layer of the plurality of quantum well layers, wherein the first quantum well layer is disposed between the electron barrier layer and the first conductive type semiconductor layer and the second quantum well layer is disposed between the electron barrier layer and the second conductive type semiconductor layer,
wherein the electron barrier layer comprises an AlGaN based semiconductor layer, and
wherein the active layer comprises the multi-quantum well structure with a cycle of the quantum well layer and the quantum barrier layer.

13. The semiconductor light emitting device according to claim 12, wherein the active layer comprises a cycle of quantum well and quantum barrier layers, the cycle being alternatively repeated about two times to about twenty times.

14. The semiconductor light emitting device according to claim 12,
wherein the active layer comprises a first active layer under the electron barrier layer and a second active layer on the electron barrier layer, and a cycle of quantum well and quantum barrier layers of the first active layer is shorter than a cycle of quantum well and quantum barrier layers of the second active layer, and
wherein the electron barrier layer includes an AlGaN based semiconductor layer.

15. The semiconductor light emitting device according to claim 12, wherein the electron barrier layer comprises a thickness ranging from about 150 Å to about 300 Å.

16. The semiconductor light emitting device according to claim 12, wherein the electron barrier layer has an energy band gap higher than that of the quantum barrier layer of the active layer.

17. A semiconductor light emitting device, comprising:
a first conductive type semiconductor layer;
an active layer comprising a first active layer, a second active layer, and an electron barrier layer, the active layer being formed on the first conductive type semiconductor layer, wherein the first active layer and the second active layer each comprises a quantum well layer and a quantum barrier layer, and an energy band gap of the electron barrier layer is greater than an energy band gap of the quantum barrier layer of the first active layer and is greater than an energy band gap of the quantum barrier layer of the second active layer; and
a second conductive type semiconductor layer on the active layer,
wherein the active layer comprises a multi-quantum well structure with a cycle of the quantum well layer and the quantum barrier layer,
wherein the electron barrier layer is in physical contact with at least one of the quantum well layers of the active layer, and
wherein the electron barrier layer comprises a laminated structure of an $Al_xIn_yGa_{1-x-y}N/Al_xGa_{1-x}N$ ($0<x\leq1$, $0\leq y<0.5$, $0<x+y<1$) layers.

18. The semiconductor light emitting device according to claim 17, wherein an upper surface of the electron barrier layer is physically contacted with an upper surface of a quantum well layer of the first active layer and a lower surface of the electron barrier layer is physically contacted with a lower surface of a quantum well layer of the second active layer.

19. The semiconductor light emitting device according to claim 17, wherein the electron barrier layer comprises a thickness ranging from about 150 Å to about 300 Å.

* * * * *